(12) United States Patent
Huang et al.

(10) Patent No.: US 7,633,601 B2
(45) Date of Patent: Dec. 15, 2009

(54) METHOD AND RELATED OPERATION SYSTEM FOR IMMERSION LITHOGRAPHY

(75) Inventors: Yong-Fa Huang, Yun-Lin Hsien (TW); Benjamin Szu-Min Lin, Tai-Nan (TW); Chun-Chi Yu, Taipei (TW); Huan-Ting Tseng, Kao-Hsiung Hsien (TW); Bo-Jou Lu, Tainan Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 429 days.

(21) Appl. No.: 11/308,245

(22) Filed: Mar. 14, 2006

(65) Prior Publication Data

US 2007/0215040 A1 Sep. 20, 2007

(51) Int. Cl.
G03B 27/32 (2006.01)
(52) U.S. Cl. .............................. 355/77; 355/53; 700/121
(58) Field of Classification Search .................... 355/53, 355/77; 118/54; 359/380; 700/121
See application file for complete search history.

(56) References Cited

U.S. PATENT DOCUMENTS

| | | | | |
|---|---|---|---|---|
| 6,099,598 A | * | 8/2000 | Yokoyama et al. | 29/25.01 |
| 6,746,972 B1 | * | 6/2004 | Kim et al. | 438/795 |
| 7,274,429 B2 | * | 9/2007 | Paxton et al. | 355/27 |
| 2003/0083778 A1 | * | 5/2003 | Masotta | 700/219 |
| 2004/0229441 A1 | | 11/2004 | Sugimoto | |
| 2005/0046934 A1 | * | 3/2005 | Ho et al. | 359/380 |
| 2005/0266323 A1 | | 12/2005 | Raulea | |
| 2006/0246357 A1 | * | 11/2006 | Chen et al. | 430/5 |
| 2007/0122551 A1 | | 5/2007 | Yamamoto et al. | |

FOREIGN PATENT DOCUMENTS

JP P2005-197469 A 7/2005

* cited by examiner

Primary Examiner—Diane I Lee
Assistant Examiner—Steven H Whitesell-Gordon
(74) Attorney, Agent, or Firm—Winston Hsu

(57) ABSTRACT

To avoid the yield of wafers that undergo immersion lithography influencing by delay of post exposure baking (PEB), an operation system adjusts a speed of inputting the wafers to undergo immersion lithography according to a status of wafers that have finished exposure and are waiting for baking. Therefore, the wafers that have finished exposure are transmitted to be baked efficiently and on time.

8 Claims, 5 Drawing Sheets

METHOD AND RELATED OPERATION SYSTEM FOR IMMERSION LITHOGRAPHY

BACKGROUND OF THE INVENTION

1. Field of the Invention

The present invention relates generally to the field of semiconductor fabrication and, more particularly, to a method and related operation system for immersion lithography.

2. Description of the Prior Art

Photolithographic systems have been a mainstay of semiconductor device patterning for decades. In photolithographic systems, as known in the art, light is projected onto a photoresist for the purpose of patterning an electronic device on a semiconductor substrate or wafer.

The resolution ($r_0$) of a photolithographic system having a given lithographic constant $k_1$, is described by the equation $$r_0 = k_1 \lambda / NA \quad (1)$$

where $\lambda$ is the operational wavelength, and the numerical aperture (NA) is given by the equation $$NA = n \sin \theta_0 \quad (2)$$

The angle $\theta_0$ is the angular semi-aperture of the system, and n is the index of the material filling the space between the system and the substrate to be patterned.

Conventional methods of resolution improvement have led to three trends in the photolithographic technology: (1) reduction in wavelength $\lambda$ from mercury g-line (436 nm) to the 193 nm excimer laser, and further to 157 nm and the still developing extreme-ultraviolet (EUV) wavelengths; (2) implementation of resolution enhancement techniques such as phase-shifting masks, and off-axis illumination have led to a reduction in the lithographic constant $k_1$ from 0.6 to values approaching 0.4; and (3) increases in the numerical aperture (NA) via improvements in optical designs, manufacturing techniques, and metrology. Such improvements have led to increases in NA from approximately 0.35 to greater than 0.7, with 0.8 expected in the next few years. However, as can be seen in Equation (2), for free-space optical systems (i.e., n=1), there is a theoretical limit bounding NA to values of one or less.

Immersion lithography provides another possibility for increasing the NA of an optical lithographic system. Immersion lithography is a technology in which lithographic exposure of a resist coated wafer is performed with immersion fluid such as purified water introduced between the projection lens of a stepper and the wafer. The light source of the leading-edge stepper currently used in production lines is the ArF 193 nm excimer laser, and its resolution is approximately 90 nm. 65 nm is said to be the limit even for a system for research and development. The idea behind immersion lithography is to use the same ArF light source and yet realize a semiconductor process technology that achieves a resolution higher than 65 nm.

Because immersion lithography utilizes immersion fluid such as purified water to increase the NA of an optical lithographic system, the exposed wafers are subjected to thermal treatment by post exposure baking (PEB) to evaporate the fluid on the photoresist so as to avoid watermarks. In addition, according to the result of experiments, the length of wires on the wafers is related to the length of the duration when the wafers are waiting for baking after exposure. In general, the longer the duration is, the narrower the length of wires on the wafers is. Therefore, if the duration when the wafers are waiting for baking after exposure is too long, the circuits on the wafers could be broken down.

SUMMARY OF THE INVENTION

It is therefore a primary objective of the present invention to provide a method and related operation system for immersion lithography to solve the prior art problems.

The method for immersion lithography comprises calculating a number of wafers beginning to undergo immersion lithography within a time interval, calculating a number of wafers finishing undergoing immersion lithography within a time interval; and adjusting a speed of inputting the wafers to undergo immersion lithography according to the calculated numbers.

In accordance with one preferred embodiment, the method for immersion lithography comprises adjusting a speed of inputting the wafers to undergo immersion lithography according to a status of wafers that have finished exposure and are waiting for baking.

In accordance with one preferred embodiment of the operation system for immersion lithography of semiconductor fabrication, the operation system comprises an exposure machine set for exposing wafers by processing immersion lithography to form a plurality of exposure patterns on the wafer, a baking machine set for baking the wafers after exposure, and a control device for adjusting a speed of inputting the wafers to undergo immersion lithography according to a number of wafers inputted into the exposure machine set within a time interval and a number of wafers baked by the baking machine set within a time interval.

In accordance with one preferred embodiment of the operation system for immersion lithography of semiconductor fabrication, the operation system comprises an exposure machine set for exposing wafers by processing immersion lithography to form a plurality of exposure patterns on the wafer, a baking machine set for baking the wafers after exposure, a waiting frame coupled between the exposure machine set and the baking machine set for placing the wafers waiting for baking after exposure, and a control device for adjusting a speed of inputting the wafers to undergo immersion lithography according to a status of wafers that have finished exposure and are waiting for baking.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
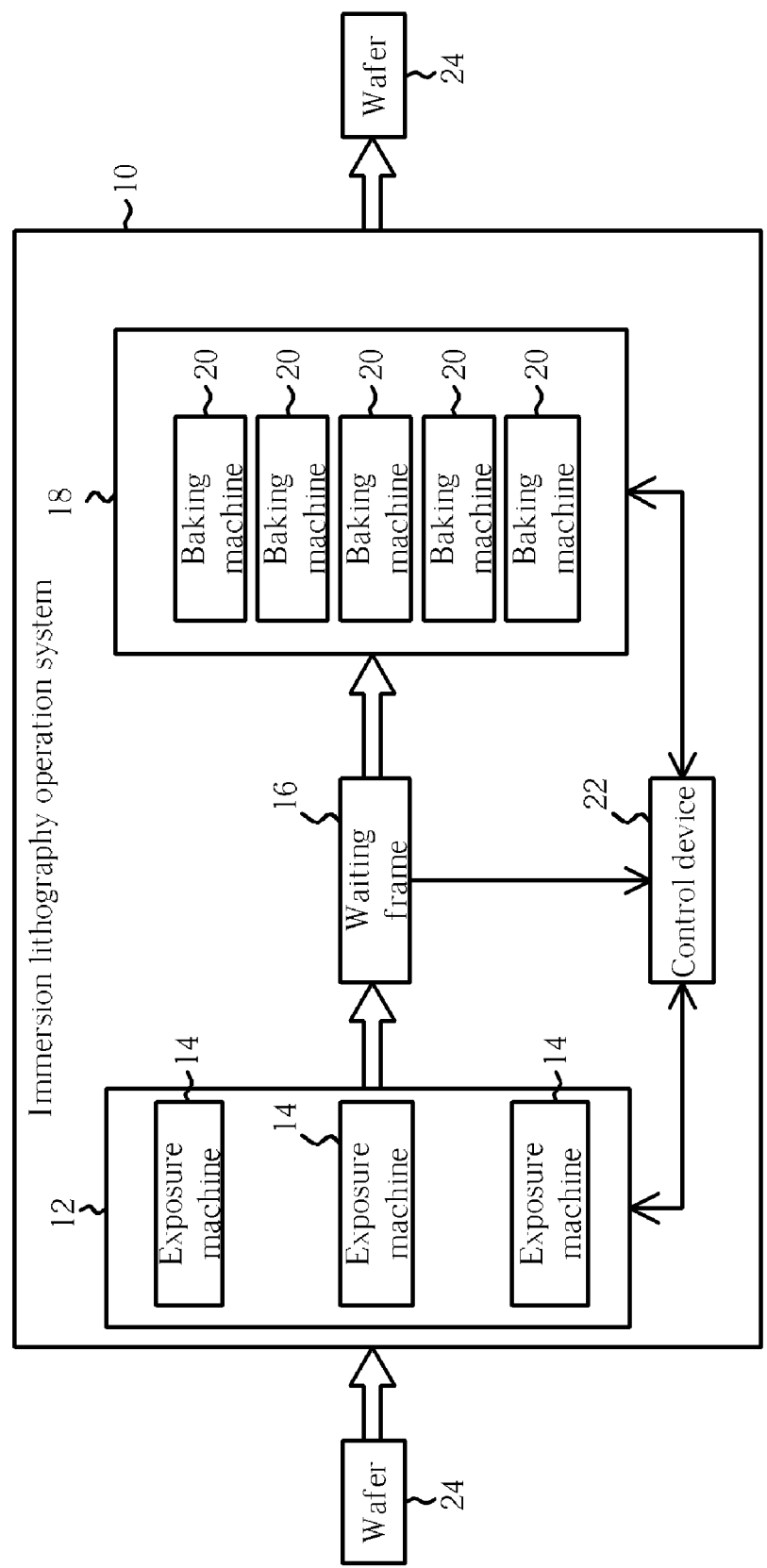
FIG. 1 is a block diagram of an operation system for immersion lithography of the present invention.

Please refer to FIG. 1, which is a block diagram of an operation system 10 for immersion lithography of the present invention. The operation system 10 is used to perform immersion lithography to process semiconductor wafers. The operation system 10 has an exposure machine set 12, a waiting frame 16, a baking machine set 18, and a control device 22. The exposure machine set 12 comprises a plurality of exposure machines 14, each being used for exposing the wafers 24 by processing immersion lithography to form a plurality of exposure patterns (not shown) on the wafer 24. Because immersion lithography utilizes immersion fluid such as purified water, the baking machines 20 are used to post exposure bake (PEB) the exposed wafers 24 to avoid watermarks on the photoresist. The waiting frame 16 is coupled to the exposure machine set 12 and the baking machine set 18 for placing the wafers 24 waiting for baking after exposure. The control device 22 is used to adjust the load of the exposure machine set 12 and the baking machine set 18 according to the statuses of the exposure machines 14, the waiting frame 16, and the baking machines 20. It is noted that the present invention is not limited by the number of the exposure machines 14 of the exposure machine set 12 or by the number of the baking machines 20 of the baking machine set 18. In other words, the exposure machine set 12 can comprises a single exposure machine 14 and the baking machine set 18 can comprises a single baking machine 20.

Figure 2:
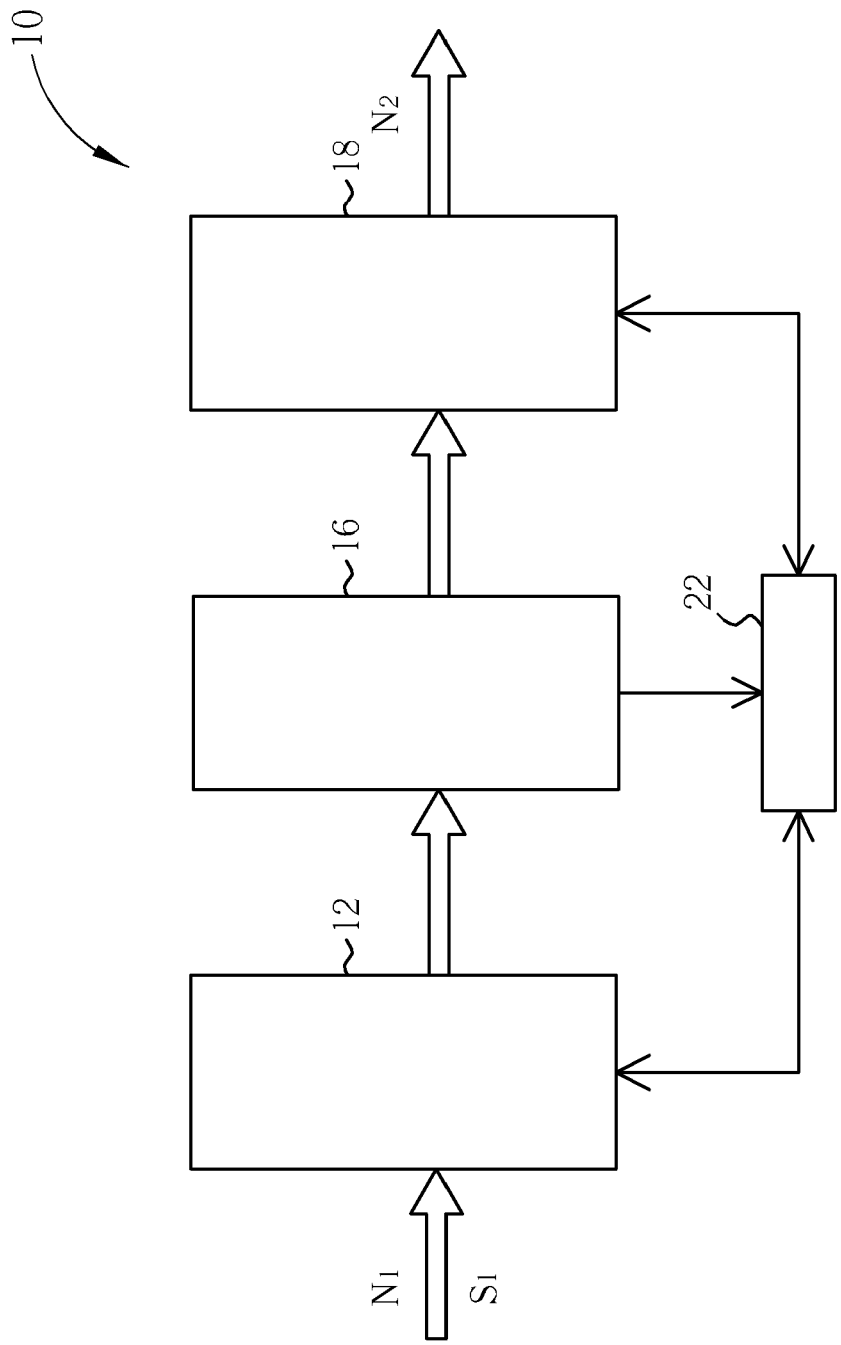
FIG. 2 is a block diagram of the operation system operating in a first operation mode.

Please refer to FIG. 2, which is a block diagram of the operation system 10 operating in a first operation mode. The control device 22 calculates a number $N_1$ of wafers 24 which begin to undergo immersion lithography within a time interval, and calculates a number $N_2$ of wafers 24 which finishing undergoing immersion lithography within a time interval. Then the control device 22 adjusts the speed $S_1$ of inputting the wafers 24 to undergo immersion lithography according to the numbers $N_1$ and $N_2$. For example, when the number $N_1$ of wafers 24 beginning to undergo immersion lithography within the time interval is greater than the number $N_2$ of wafers 24 finishing undergoing immersion lithography within the time interval, the control device 22 slows down the speed Si of inputting the wafers 24 to undergo immersion lithography. Oppositely, when the number $N_1$ of wafers 24 beginning to undergo immersion lithography within the time interval is less than the number $N_2$ of wafers 24 finishing undergoing immersion lithography within the time interval, the control device 22 speeds up the speed $S_1$ of inputting the wafers 24 to undergo immersion lithography. Therefore, the wafer 24 placed on the waiting frame 16 is not idle too long because of an excessive rush speed $S_1$.

Figure 3:
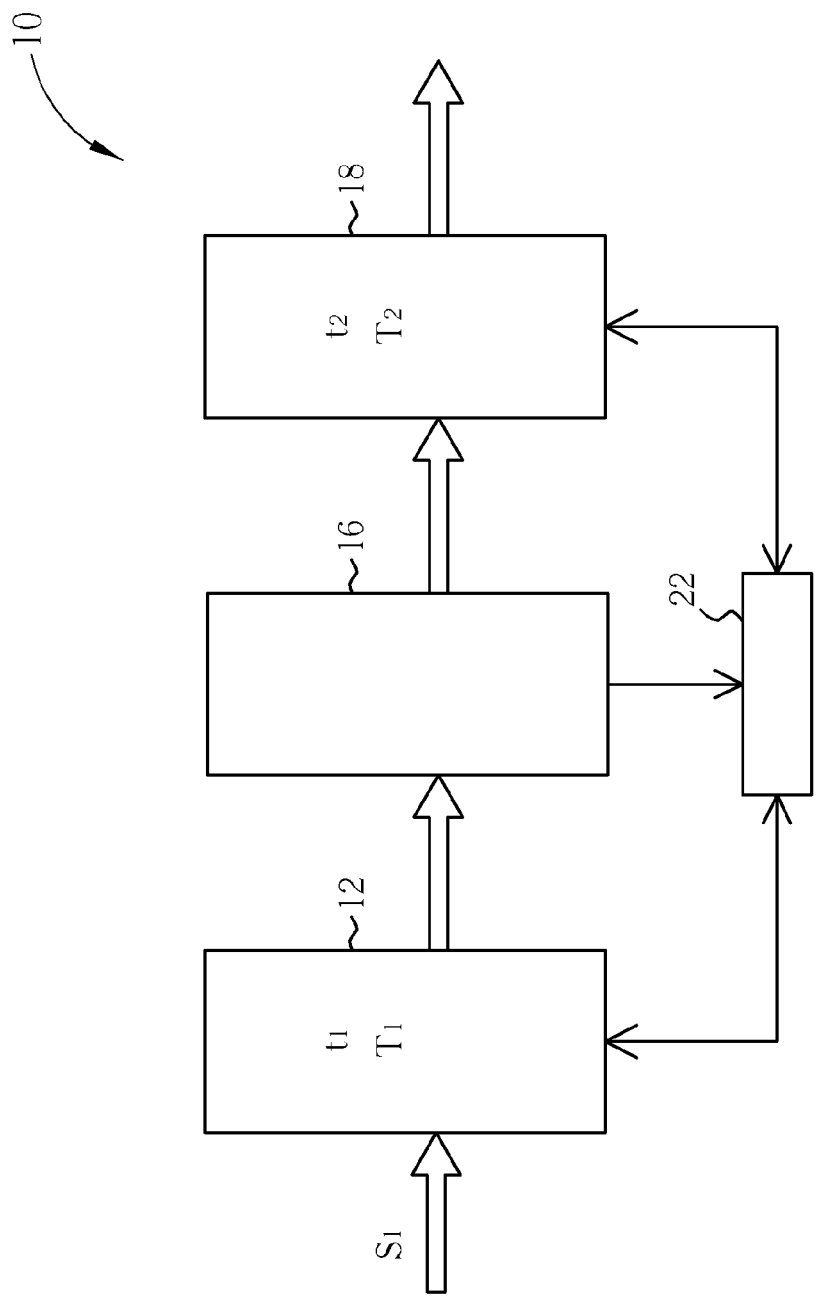
FIG. 3 is a block diagram of the operation system operating in a second operation mode.

Please refer to FIG. 3, which is a block diagram of the operation system 10 operating in a second operation mode. In the embodiment, the control device 22 gathers information about the time $t_1$ and $t_2$, which are respectively for exposing and baking the wafer 24, from the recipes of immersion lithography. Then the control device 22 analyses the time interval $T_1$ between the exposure steps of every two wafers, and the time interval $T_2$ between the baking steps of every two wafers. Finally, the control device 22 sets the time points for inputting wafers to undergo immersion lithography to make the time interval $T_1$ always be not less than the time interval $T_2$. Therefore, the wafers placed on the waiting frame 16 will not be idle.

Figure 4:
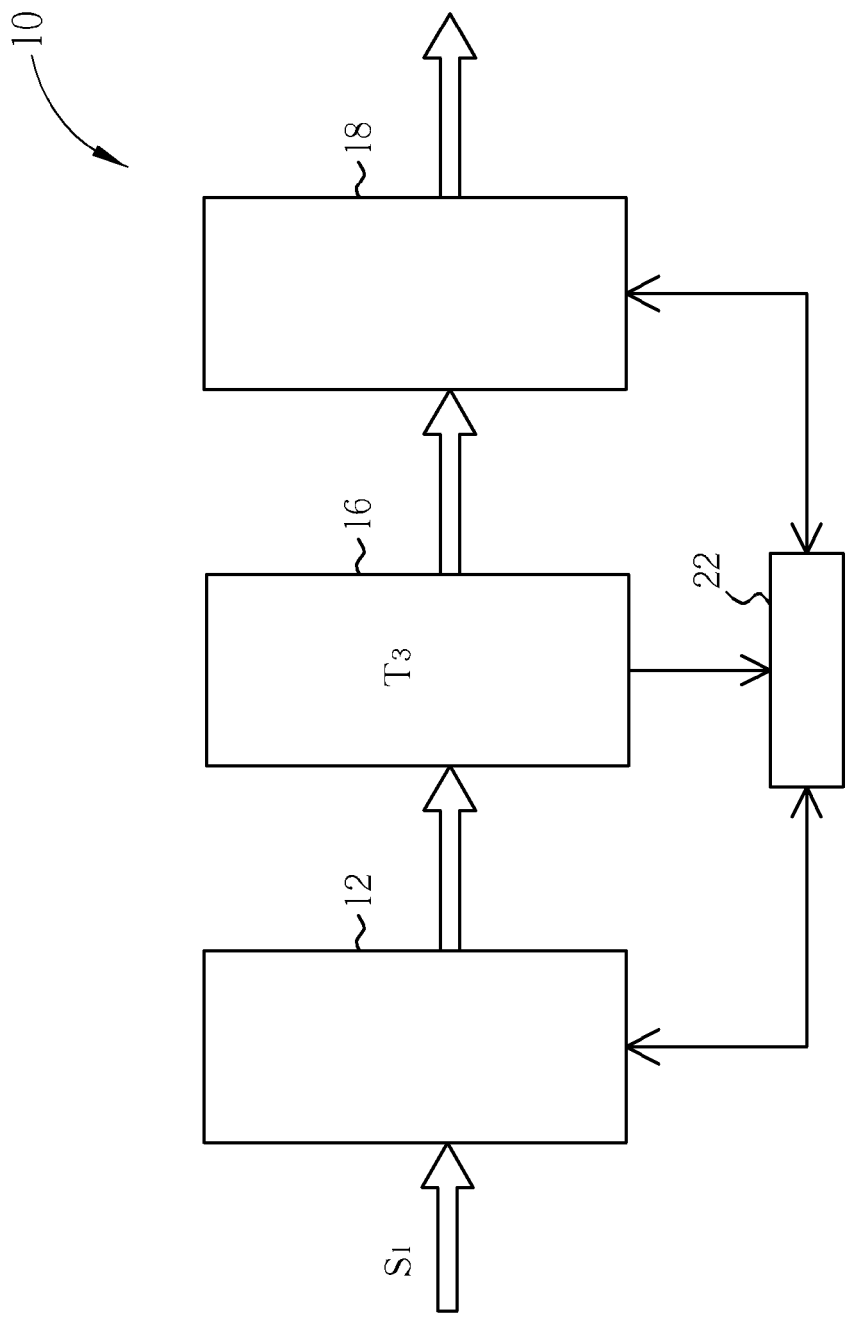
FIG. 4 is a block diagram of the operation system operating in a third operation mode.

Please refer to FIG. 4, which is a block diagram of the operation system 10 operating in a third operation mode. In the embodiment, the control device 22 adjusts the speed $S_1$ of inputting the wafers 24 to undergo immersion lithography according to a length of a duration $T_3$ when the wafers 24 waiting for baking after exposure. For example, if the length of the duration $T_3$ is greater than a predetermined value, such as 100 seconds, the control device 22 slows down the speed $S_1$ of inputting the wafers 24 to undergo immersion lithography. Oppositely, if the length of the duration $T_3$ is less than a predetermined value, such as 10 seconds, the control device 22 speeds up the speed $S_1$ of inputting the wafers 24 to undergo immersion lithography.

Figure 5:
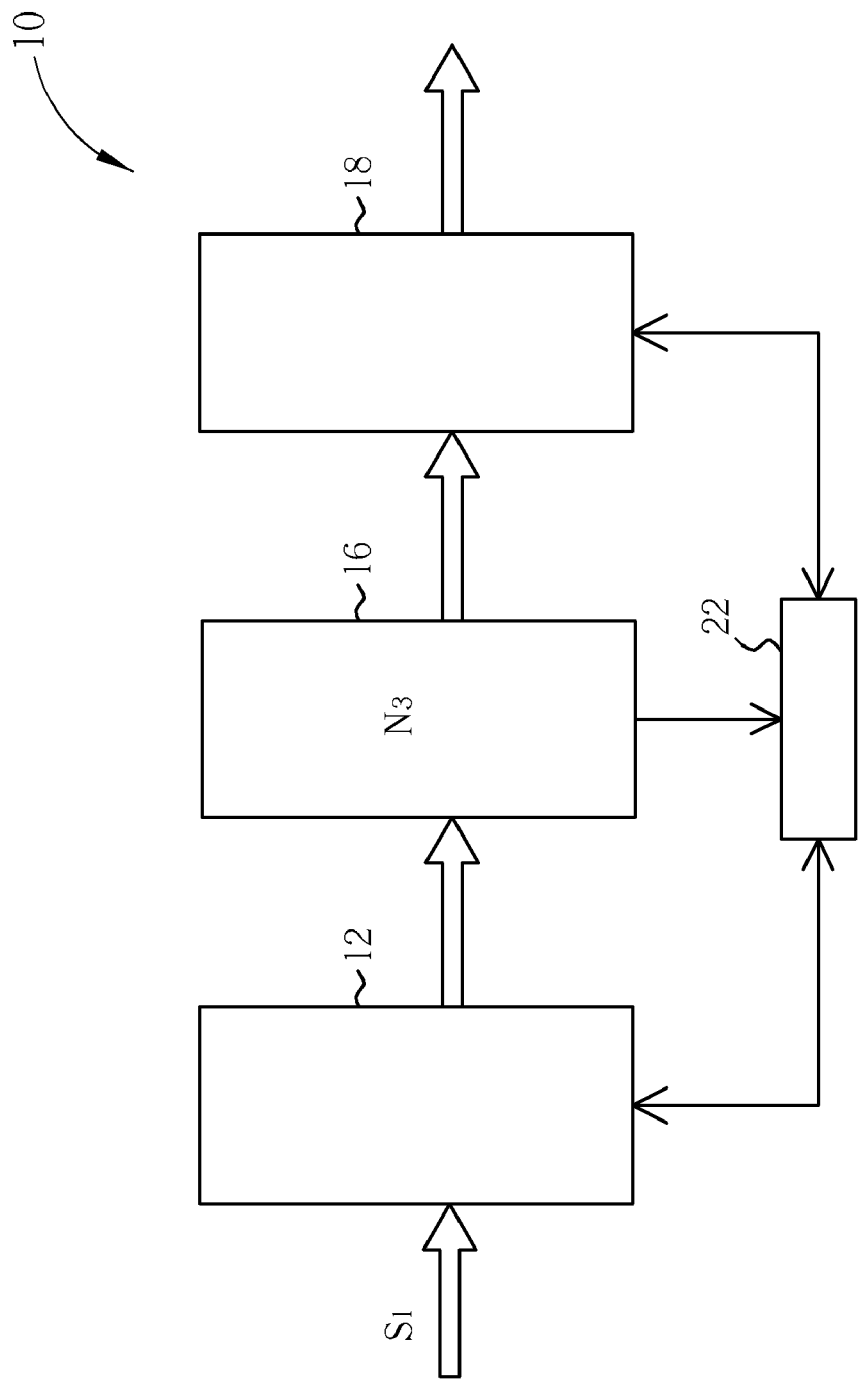
FIG. 5 is a block diagram of the operation system operating in a fourth operation mode.

Please refer to FIG. 5, which is a block diagram of the operation system 10 operating in a fourth operation mode. In the embodiment, the control device 22 adjusts the speed $S_1$ of inputting the wafers 24 to undergo immersion lithography according to the number $N_3$ of wafers 24 that are waiting for baking on the waiting frame 16. For example, if the number $N_3$ of wafers 24 that are waiting for baking is greater than a predetermined value, such as 10, the control device 22 slows down the speed $S_1$ of inputting the wafers 24 to undergo immersion lithography. Oppositely, if the number $N_3$ of wafers 24 that are waiting for baking is less than a predetermined value, such as 3, the control device 22 speeds up the speed $S_1$ of inputting the wafers 24 to undergo immersion lithography.

In contrast to the prior art, the present invention provides a method and related operation system for immersion lithography to adjust a speed of inputting the wafers to undergo immersion lithography according to a status of wafers that have finished exposure and are waiting for baking to prevent the yield of wafers that undergo immersion lithography from being influenced by a delay of post exposure baking (PEB). Therefore, the yield of wafers that undergo immersion lithography can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for controlling immersion lithography process of wafers, the immersion lithography process sequentially comprising an immersion lithography exposure step and a baking step, the method for avoiding defects of exposed wafers after finishing the immersion lithography exposure step and before undergoing the baking step comprising:
    adjusting a speed of wafers beginning to undergo the immersion lithography exposure step according to a number of wafers finishing the baking step;
    adjusting the speed of wafers beginning to undergo the immersion lithography exposure step by comparing a first time interval between the exposure step of a plurality of wafers and a second time interval between the baking step of a plurality of wafers;
    adjusting the speed of wafers beginning to undergo the immersion lithography exposure step according to a length of duration of the exposed wafers waiting to undergo the baking step; and
    adjusting the speed of wafers beginning to undergo the immersion lithography exposure step according to a number of exposed wafers waiting to undergo the baking step.

2. The method of claim 1, wherein adjusting the speed of wafers beginning to undergo the immersion lithography exposure step according to the number of wafers finishing the baking step comprises:
    speeding up the speed of wafers beginning to undergo the immersion lithography exposure step when the number of wafers finishing the baking step is larger than the number of wafers waiting to undergo the immersion lithography exposure step; and
    slowing down the speed of wafers beginning to undergo the immersion lithography exposure step when the number of wafers finishing the baking step is less than the number of wafers waiting to undergo the immersion lithography exposure step.

3. The method of claim 1, adjusting the speed of wafers beginning to undergo the immersion lithography exposure step according to the length of duration of the exposed wafers waiting to undergo the baking step comprises:
   speeding up the speed of wafers beginning to undergo the immersion lithography exposure step when the length of duration when the exposed wafers are waiting to undergo the baking step is less than a predetermined value; and
   slowing down the speed of wafers beginning to undergo the immersion lithography exposure step when the length of duration when the exposed wafers are waiting to undergo the baking step is more than the predetermined value.

4. The method of claim 1 wherein the defects include watermarks.

5. The method of claim 1 wherein the immersion lithography process is utilizing a plurality of exposure machines to respectively expose a plurality of wafers by executing the immersion lithography exposure step to produce a plurality of exposed wafers and then utilizing a plurality of baking machines to respectively bake the exposed wafers by executing the baking step to produce a plurality of baked wafers.

6. The method of claim 5 further comprising stopping wafers from entering the immersion lithography exposure step when all of the baking machines process the baking step.

7. The method of claim 1, wherein adjusting the speed of wafers beginning to undergo the immersion lithography exposure step according to the number of exposed wafers waiting to undergo the baking step comprises:
   speeding up the speed of wafers beginning to undergo the immersion lithography exposure step when the number of the exposed wafers waiting to undergo the baking step is less than a predetermined number; and
   slowing down the speed of wafers beginning to undergo the immersion lithography exposure step when the number of the exposed wafers waiting to undergo the baking step is larger than a predetermined number.

8. The method of claim 1, wherein adjusting the speed of wafers beginning to undergo the immersion lithography exposure step by comparing the first time interval between the exposure step of the plurality of wafers and the second time interval between the baking step of the plurality of wafers comprises:
   slowing down the speed of wafers beginning to undergo the immersion lithography exposure step when the first time interval between the exposure step of the plurality of wafers is less than the second time interval between the baking step of the plurality of wafers.

\* \* \* \* \*